United States Patent
Gaul et al.

(10) Patent No.: US 11,735,257 B2
(45) Date of Patent: Aug. 22, 2023

(54) MEMORY WITH HIGH-ACCURACY REFERENCE-FREE MULTI-INVERTER SENSE CIRCUIT AND ASSOCIATED SENSING METHOD

(71) Applicant: GLOBALFOUNDRIES U.S. Inc., Malta, NY (US)

(72) Inventors: Nishtha Gaul, Halfmoon, NY (US); Bipul C. Paul, Mechanicville, NY (US); Akhilesh R. Jaiswal, Falls Church, VA (US)

(73) Assignee: GlobalFoundries U.S. Inc., Malta, NY (US)

( * ) Notice: Subject to any disclaimer, the term of this patent is extended or adjusted under 35 U.S.C. 154(b) by 16 days.

(21) Appl. No.: 17/380,093

(22) Filed: Jul. 20, 2021

(65) Prior Publication Data
US 2023/0027460 A1    Jan. 26, 2023

(51) Int. Cl.
*G11C 7/12*    (2006.01)
*G11C 13/00*    (2006.01)
(Continued)

(52) U.S. Cl.
CPC .......... *G11C 13/004* (2013.01); *G11C 11/161* (2013.01); *G11C 11/1673* (2013.01);
(Continued)

(58) Field of Classification Search
CPC ............ G11C 11/4091; G11C 11/4074; G11C 11/4085; G11C 11/4094; H03K 19/01721
See application file for complete search history.

(56) References Cited

U.S. PATENT DOCUMENTS 5,761,213 A * 6/1998 Adams ...................... G06F 7/02
714/736
6,137,319 A * 10/2000 Krishnamurthy ... H03F 3/45188
327/51
(Continued)

OTHER PUBLICATIONS

Chen et al., "A Nondestructive Self-Reference Scheme for Spin-Transfer Torque Random Access Memory (STT-RAM)", IEEE, 2010, pp. 1-6.
(Continued)

*Primary Examiner* — Mushfique Siddique
(74) *Attorney, Agent, or Firm* — David Cain; Hoffman Warnick LLC

(57) ABSTRACT

Disclosed is a memory structure with reference-free single-ended sensing. The structure includes an array of non-volatile memory (NVM) cells (e.g., resistance programmable NVM cells) and a sense circuit connected to the array via a data line and a column decoder. The sense circuit includes field effect transistors (FETs) connected in parallel between an output node and a switch and inverters connected between the data line and the gates of the FETs, respectively. To determine the logic value of a stored bit, the inverters are used to detect whether or not a voltage drop occurs on the data line within a predetermined period of time. Using redundant inverters to control redundant FETs connected to the output node increases the likelihood that the occurrence of the voltage drop will be detected and captured at the output node, even in the presence of process and/or thermal variations. Also disclosed is a sensing method.

18 Claims, 5 Drawing Sheets

(51) Int. Cl.
*H03K 19/017* (2006.01)
*G11C 11/16* (2006.01)

(52) U.S. Cl.
CPC .... *H03K 19/01721* (2013.01); *G11C 11/1659* (2013.01); *G11C 2213/79* (2013.01)

(56) References Cited

U.S. PATENT DOCUMENTS

| | | | |
|---|---|---|---|
| 7,986,571 | B2 | 7/2011 | Arsovski et al. |
| 9,224,437 | B2 * | 12/2015 | Barth, Jr. ............ G11C 11/4091 |
| 9,704,575 | B1 * | 7/2017 | Arsovski ................ G11C 15/04 |
| 10,515,679 | B2 | 12/2019 | Jaiswal et al. |
| 2013/0128680 | A1 | 5/2013 | Holla et al. |
| 2013/0176773 | A1 | 7/2013 | Yuh et al. |
| 2014/0040692 | A1 * | 2/2014 | Shah .................... G11C 29/021 |
| | | | 714/E11.167 |
| 2020/0035272 | A1 * | 1/2020 | Nakaoka ............. G11C 29/026 |
| 2021/0193204 | A1 | 6/2021 | Jaiswal et al. |

OTHER PUBLICATIONS

Ikegami et al., "MTJ-Based "Normally-Off Processors" with Thermal Stability Factor Engineered Perpendicular MTJ, L2 Cache Based on 2T-2MTJ Cell, L3 and Last Level Cache Based on 1T-1MTJ Cell and Novel Error Handling Scheme", IEEE, 2015, pp. 1-4.

* cited by examiner

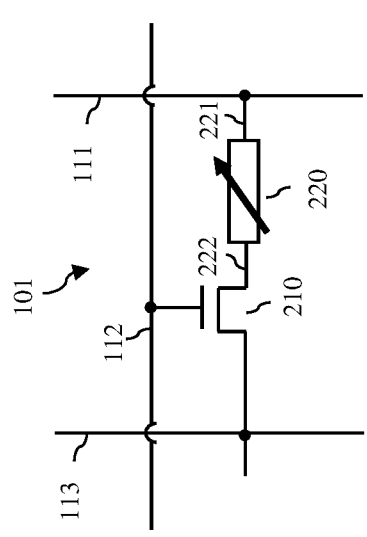
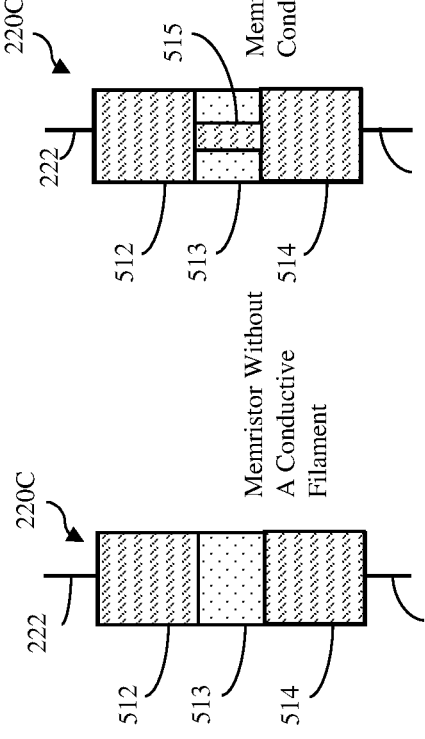
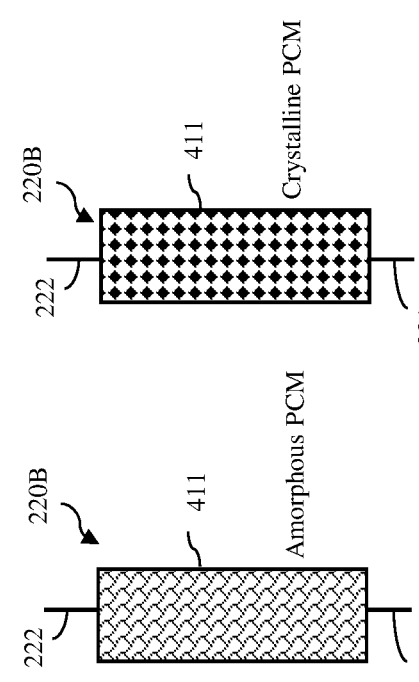

MEMORY WITH HIGH-ACCURACY REFERENCE-FREE MULTI-INVERTER SENSE CIRCUIT AND ASSOCIATED SENSING METHOD

BACKGROUND

Field of the Invention

The present invention relates to memories and, more particularly, to embodiments of a memory with a high-accuracy reference-free multi-inverter sense circuit and of an associated sensing method.

Description of Related Art

Resistive nonvolatile memory (NVM) structures are currently being considered by integrated circuit designers as suitable replacements for other non-volatile memory structures because of advantages including high speed, low power consumption, non-volatility, and potentially low area consumption. Such resistive NVM structures typically employ a single-ended sensing scheme and a reference parameter for read operations. That is, during a read operation, an output parameter (e.g., an output voltage or output current) from a selected memory cell is compared to a reference parameter (e.g., a reference voltage or reference current) generated by a reference circuit to determine if the selected memory cell has a low resistance state (e.g., stores a bit with a value of 0) or a high resistance state (e.g., stores a bit with a value of 1). Unfortunately, with the current technologies, the reference parameter generated by a reference circuit can be highly variable due to inherent process and thermal variations and this reference parameter variability can lead to read errors.

SUMMARY

Disclosed herein are embodiments of a memory structure. The memory structure can include a memory array and, particularly, an array of non-volatile memory (NVM) cells (e.g., in resistance-programmable NVM cells or threshold voltage-programmable NVM cells) and a data line connected to the memory array (e.g., via a column decoder). The memory structure can further include a high-accuracy reference-free multi-inverter sense circuit connected to the data line. The sense circuit can include an output node, a switch (e.g., a footer device that connects the sense circuit to ground and is controlled by a sense enable signal), and multiple field effect transistor (FETs) connected in parallel between the output node and the switch. The sense circuit can further include multiple inverters, one for each of the multiple FETs. In one exemplary embodiment, the sense circuit can have three FETs and three inverters, one for each of the three FETs. In any case, the inverters can be connected between the data line and the gates of the FETs, respectively. That is, each inverter can have an input connected to the data line and an output connected to the gate of a corresponding one of the FETs.

Also disclosed herein are associated sensing method embodiments. The method embodiments can include accessing a memory structure, as described above. The method embodiments can further include performing a read operation using a highly accurate reference-free single-ended sensing scheme. Specifically, the method can include turning on the switch (e.g., the footer device that connects the sense circuit to ground and is controlled by a sense enable signal) for a predetermined period of time and sensing the level of the output voltage on the output node at the end of the predetermined period of time. With this sense circuit configuration, the output voltage on the output node at the end of the predetermined period of time will be at either a first voltage level or a second voltage level that is greater than the first voltage level. More particularly, at the end of the predetermined period of time, the output voltage will be at the first voltage level if a voltage drop on the data line causes at least one of the multiple inverters to switch output states so that at least one of the multiple FETs turns on and thereby pulls the output voltage on the output node down to the first voltage level from the second voltage level. However, at the end of the predetermined period of time, the output voltage will remain at the second voltage level if the voltage drop on the data line (if any) is insufficient to cause any of the inverters to switch output states.

BRIEF DESCRIPTION OF THE SEVERAL VIEWS OF THE DRAWINGS

The present invention will be better understood from the following detailed description with reference to the drawings, which are not necessarily drawn to scale and in which:

FIG. 2 is a schematic diagram illustrating an exemplary resistance-programmable NVM cell that can be incorporated into the memory array of the memory structure of FIG. 1;

FIGS. 3A-3B illustrate an exemplary MTJ-type variable resistor in a high resistance state and in a low resistance state, respectively;\

FIGS. 4A-4B illustrate an exemplary PCM-type variable resistor in a high resistance state and in a low resistance state, respectively;

FIG. 5A-5B illustrate an exemplary memristor in a high resistance state and in a low resistance state, respectively;

DETAILED DESCRIPTION

Figure 1:
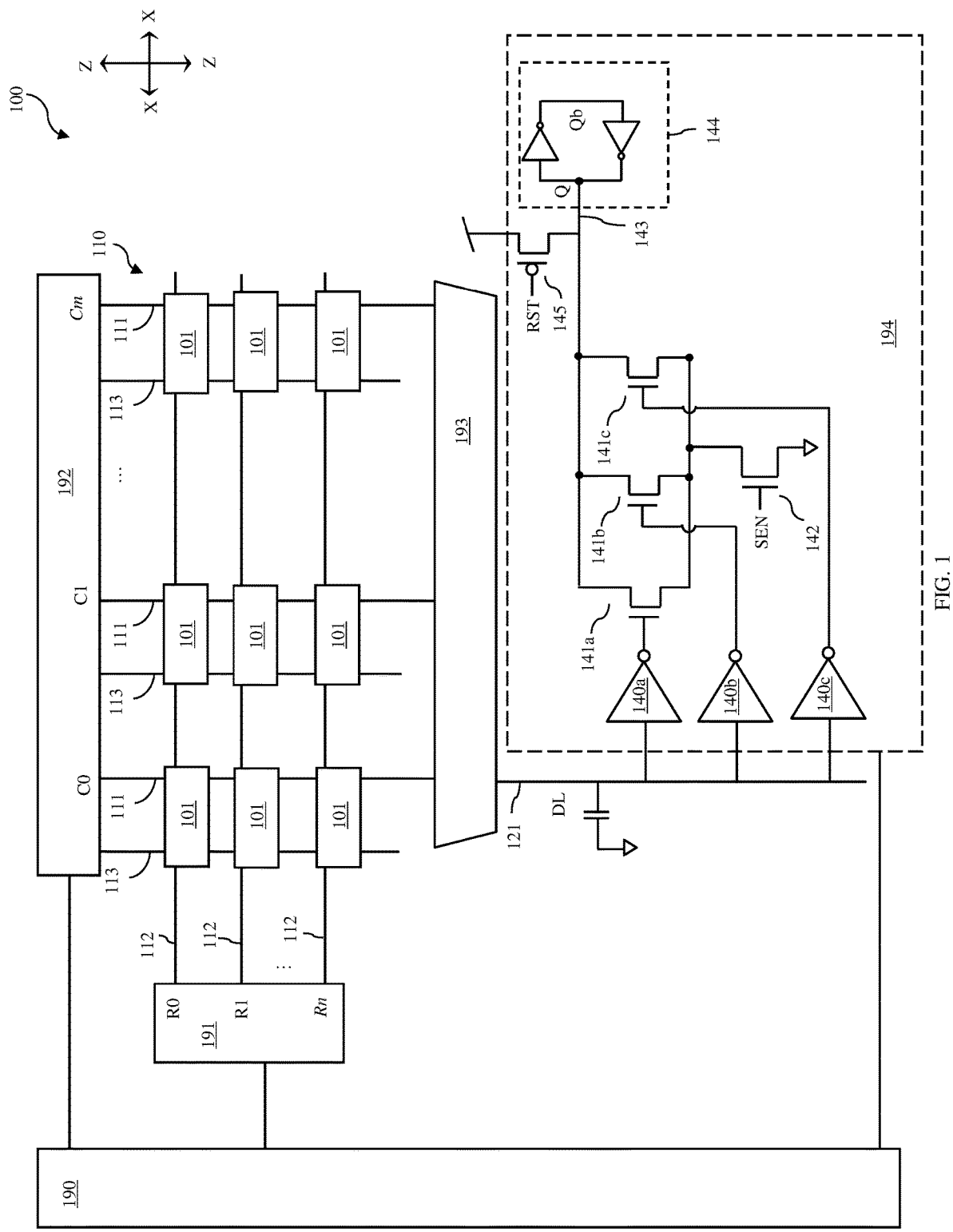
FIG. 1 is schematic diagram illustrating embodiments of a memory structure including a high-accuracy reference-free multi-inverter sense circuit.

As mentioned above, resistive nonvolatile memory (NVM) structures are currently being considered by integrated circuit designers as suitable replacements for other non-volatile memory structures because of advantages including high speed, low power consumption, non-volatility, and potentially low area consumption.

One exemplary resistive NVM structure is a magnetic random access memory (MRAM) structure. A MRAM structure typically includes an array of MRAM cells arranged in columns and rows. The simplest MRAM cell includes an access transistor (e.g., an n-type field effect transistor (NFET)) and a single magnetic tunnel junction (MTJ)-type programmable resistor connected in series between a source line and a bitline with the gate of the access transistor controlled by the state of a wordline.

Depending upon the biasing conditions employed during a write operation, the MTJ-type programmable resistor will exhibit either a low resistance parallel state (RP) (e.g., representing a stored bit with a logic value of "0") or a high resistance anti-parallel state (RAP) (e.g., representing a stored bit with a logic value of "1"). During a read operation, the bitline is pre-charged, the source line is connected to ground and a high positive voltage (e.g., VDD) is applied to the wordline. In order to detect whether the selected MRAM cell stores a bit with a logic value of "0" or "1", a single-ended sensing scheme can be employed. For example, a sense amplifier (SA) can be employed to compare, for example, a bitline voltage (VDATA) to a reference voltage (VREF). VREF can be supplied by a reference circuit, which is designed to generate the VREF based on a reference resistance (RREF) that is midway between the resistance of a nominal MTJ-type variable resistor in the RP state (i.e., $RP_N$) and the resistance of a nominal MTJ-type variable resistor in the RAP state (i.e., $RAP_N$) or, more particularly, so that:

$RREF=(RP_N+RAP_N)/2$.

If the RREF is midway between the $RP_N$ and the $RAP_N$, then a VREF that is generated based on this RREF will be midway between the bitline voltage when the nominal MTJ is in the RP state ($V_{RPN}$) and the bitline voltage when the nominal MTJ is in the RAP states (i.e., $V_{RAPN}$). That is, $VREF=(V_{RPN}+V_{RAPN})/2$, Unfortunately, with the current technologies, generating a low variability RREF can be difficult due to inherent process and thermal variations and a high variability RREF can lead to a high variability VREF, which can lead to read errors when the difference between $V_{RPN}$ and $V_{RAPN}$ is relatively small.

In view of the foregoing disclosed herein are embodiments of a memory structure configured for high-accuracy reference-free single-ended sensing during read operations. The memory structure can include a memory array of non-volatile memory (NVM) cells (e.g., in resistance-programmable NVM cells or threshold voltage-programmable NVM cells). The memory structure can also include a high-accuracy reference-free multi-inverter sense circuit connected to the memory array (e.g., via a data line and a column decoder). The sense circuit can include multiple field effect transistors (FETs) connected in parallel between an output node and a switch (e.g., a footer device). The sense circuit can also include multiple inverters, which are connected between the data line and the gates of the FETs, respectively. Instead of determining whether an output parameter on the data line is above or below a reference parameter in order to determine the logic value of the stored bit in a selected memory cell during a read operation, this sense circuit uses the inverters to detect whether or not a voltage drop occurs on the data line within a predetermined period of time. If the occurrence of a voltage drop on the data line within the predetermined period of time causes at least one of the inverters to switch output states turning on at least one of the FETs, then the output voltage on the output node will be pulled down from a high voltage level to a low voltage level indicative of a stored bit with a first logic value (e.g., a logic value of "0"). However, if none of the inverters switch output states such that none of the FETs turn on, then the output voltage on the output node will remain at the high voltage level indicative of a stored bit with a second logic value (e.g., a logic value of "1"). By using redundant inverters to control redundant FETs connected to the output node, the disclosed embodiments increase the likelihood that the occurrence of a voltage drop on the data line within the predetermined period of time will be accurately detected and captured at the output node, even in the presence of process and/or thermal variations. Also disclosed herein are associated sensing method embodiments.

More particularly, referring to FIG. 1, disclosed herein are embodiments of a memory structure 100.

The memory structure 100 can include an array 110 of memory cells 101. The memory cells 101 within the array 110 can be arranged in columns (e.g., see columns C0-Cm) and rows (e.g., see rows R0-Rn). For purposes of illustration, the columns are shown on the drawing sheet as being oriented in the Z-direction (i.e., from the top of the sheet toward the bottom) and the rows are shown on the sheet as being oriented in the X-direction (i.e., from the left-side of the sheet to the right-side). The orientation of the columns and rows of the memory cells as shown in the figures is not intended to be limiting. Alternatively, the columns could be oriented in the X-direction and the rows could be oriented in the Z-direction. In any case, the columns can be essentially perpendicular to the rows with each memory cell 101 being at an intersection between one column and one row.

The memory structure 100 can further include bitlines 111 and source line 113 for the columns C0-Cm, respectively, and wordlines 112 for the rows R0-Rn, respectively. All memory cells 101 in each column can be electrically connected between a source line 113 and a bitline 111 for that column. All memory cells 101 in each row can be electrically connected to the wordline 112 for that row.

In some embodiments, the memory cells 101 can be resistance-programmable non-volatile memory (NVM) cells configured so that the logic value of the stored bit within each cell can be determined using a single-ended sensing scheme. FIG. 2 is a schematic diagram illustrating an exemplary resistance-programmable NVM cell that can be incorporated into the memory array 110 of the disclosed memory structure 100 at any given column and row. The resistance-programmable NVM cell can include a programmable resistor 220 (also referred to herein as a variable resistor) and an access transistor 210 (e.g., an n-type field effect transistor (NFET)) connected in series between a bitline 111 for a column and a source line 113 for the same column. Specifically, the programmable resistor 220 can have a first terminal 221 connected to the bitline 111 for the column and a second terminal 222 connected to the drain region of the access transistor 210. The source region of the access transistor 210 can be connected to the source line 113 for the column and the gate of the access transistor 210 can be connected to a wordline 112 for row.

In such resistance-programmable NVM cells, the programmable resistor 220 can be any type of programmable resistor 220 suitable for use in a resistive NVM cell. For example, the programmable resistor 220 could be a magnetic tunnel junction (MTJ)-type variable resistor, a phase change memory (PCM)-type variable resistor, or a memristor or any other suitable type of programmable resistor that is configured so that, by applying specific bias conditions to one or both of the two terminals, the resistance of the resistor can be changed between at least two different stable resistance states. For example, the resistance state of such a programmable resistor can be changed to a high resistance state to store one logic value (e.g., a logic value of "1") or to a low resistance state to store a different logic value (e.g., a logic value of "0").

FIGS. 3A-3B illustrate an exemplary MTJ-type variable resistor 220A (also referred to herein as an MTJ-type programmable resistor) that could be incorporated into a resistive NVM cell. Such an MTJ-type variable resistor 220A is typically a back end of the line (BEOL) multi-layer structure, which includes a free ferromagnetic layer 314 (also referred to as a switchable layer) at the first terminal 221 and a fixed ferromagnetic layer 312 (also referred to as a pinned layer) at the second terminal 222 and separated from the free ferromagnetic layer 314 by a thin dielectric layer 313 (e.g., a thin oxide layer). Depending upon the biasing conditions on the first terminal 221 and the second terminal 222 during a write operation, the MTJ-type programmable resistor 220A exhibits different resistances (e.g., a low resistance or a high resistance). For example, during a write operation, a high positive voltage (VDD) can be applied to the second terminal 222 and the first terminal 221 can be discharged to ground (e.g., at 0V). In this case, current flow causes the free layer to switch to (or maintain) the anti-parallel resistance (RAP) state (also referred to as a high resistance state), thereby storing one logic value (e.g., a logic value of "1") (see FIG. 3A). Alternatively, during the write operation, VDD can be applied to the first terminal 221 and the second terminal 222 can be discharged to ground (e.g., at 0V). In this case, current flow causes the free layer to switch to (or maintain) a parallel resistance (RP) state (also referred as a low resistance state), thereby storing another logic value (e.g., a logic value of "0") (see FIG. 3B).

FIGS. 4A-4B illustrate an exemplary PCM-type variable resistor 220B (also referred to herein as a PCM-type programmable resistor) that could be incorporated into a resistive NVM cell. Such a PCM-type variable resistor employs a phase change material 411 (e.g., a chalcogenide compound) with programmable structural phases that exhibit different resistances. Switching of the phase is dependent upon the local temperature, which is controlled by the length and strength of an applied voltage. For example, switching from a crystalline to an amorphous phase to store one logic value (e.g., a logic value of "1") can be achieved by applying a short high voltage pulse to one or both of the terminals 221-222 in order to quickly heat the phase change material above its melting point (see FIG. 4A). Switching from an amorphous phase to the crystalline phase to store another logic value (e.g., a logic value of "0") can be achieved by applying a longer lower voltage pulse to one or both of the terminals 221-222 in order to heat the phase change material to its crystallization temperature and then allowing it to cool (see FIG. 4B).

FIG. 5A-5B illustrate an exemplary memristor 220C that could be incorporated into a resistive NVM cell. Such a memristor is also typically a back end of the line (BEOL) multi-layer structure, which includes two metal layers 512 and 514 separated by a dielectric layer 513 (e.g., hafnium oxide ($HfO_x$) or some other suitable oxide layer, also referred to as a switching layer). Depending upon the biasing conditions on the first terminal 221 and the second terminal 222 during a write operation, ions in the dielectric layer 513 may migrate to: (a) either break-up a conductive filament between the metal layers 512 and 514 so that the memristor is in a high resistance state, thereby storing one logic value (e.g., a logic value of "1") or (b) grow a conductive filament 515 in the dielectric layer 513 and extending between the metal layers 512 and 514 so that the memristor is in a low resistance state, thereby storing a different logic value (e.g., a logic value of "0").

Figure 6:
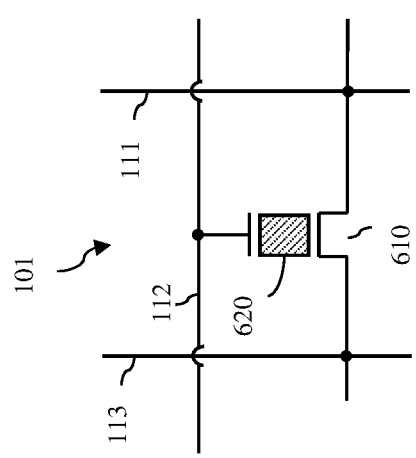
FIG. 6 is a schematic diagram illustrating an exemplary threshold voltage-programmable NVM cell that can be incorporated into the memory array of the memory structure of FIG. 1.

In other embodiments, the memory cells 101 could be any other type of NVM cells configured so that the logic value of the stored bit within each cell can be determined using a single-ended sensing scheme, such as threshold voltage (Vt)-programmable NVM cells or any other suitable type of NVM cells. FIG. 6 is a schematic diagram illustrating an exemplary Vt-programmable NVM cell that can be incorporated into the memory array 110 of the disclosed memory structure 100 at any given column and row. The Vt-programmable NVM cell can include a Vt-programmable field effect transistor (e.g., a Vt-programmable n-type field effect transistor (NFET) 610). The Vt-programmable NFET 610 can include: a gate 620, which is electrically connected to the wordline 112 for the row; a drain region, which is connected to the bitline 111 for the column; and a source region, which is connected to the source line 113 for the column. The gate 620 of the Vt-programmable NFET 610 can be configured so that, depending upon biasing conditions applied to the terminals, the threshold voltage (Vt) can be selectively programmed (i.e., changed) and, more particularly, the Vt can be switched between a low-Vt state to store one logic value (e.g., a logic value of "0") and a high-Vt state to store another logic value (e.g., a logic value of "1"). Thus, the gate 620 can effectively function as a data storage node. Exemplary Vt-programmable FETs include, but are not limited to, charge trap field effect transistors (CTFETs), ferroelectric field effect transistors (FeFETs), and floating gate field effect transistors (FGFETs). Such Vt-programmable FETs are well known in the art and, thus, the details thereof are omitted from this specification in order to allow the reader to focus on the salient aspects of the disclosed embodiments.

Referring again to FIG. 1, the memory structure 100 can further include a controller 190 and peripheral circuitry 191-194 in communication with the controller 190, connected to the array and configured to facilitate memory cell operations (e.g., write and read) in response to control signals from the controller 190. The peripheral circuitry can include a row control block 191, which is electrically connected to the WLs 112 for the rows, and which includes, for example, address decode logic and wordline drivers for appropriately biasing specific wordlines depending upon the type of memory cell and the mode of operation. The peripheral circuitry can also include a column control block 192, which is electrically connected to bitlines 111 and source lines 113 for the columns and which includes, for example, column address decode logic and bitline drivers and, source line drivers for appropriately biasing specific bitlines and source lines depending upon the type of memory cell and the mode of operation. The peripheral circuitry can also include column decoder 193. The column decoder 193 can include, for example, column address decode logic and a multiplexor (MUX). The column decoder 193 can have multiple inputs and each input can be connected to a corresponding one of the bitlines 111 for multiple columns. The column decoder 193 can further have a single output connected to a data line 121. The column decoder 193 can be configured to selectively connect a specific bitline for a specific column to the DL 121 during a read operation directed to a selected memory cell 101 in the array 110 and located in the specific column and at a specific row. The peripheral circuitry features described above are well known in the art and, thus, the details thereof have been omitted from the specification to allow the reader to focus on the salient aspects of the disclosed embodiments.

The peripheral circuitry can also include a sense circuit 194, which is connected to the array 110 via the data line 121 and the column decoder 193, and which enables high-accuracy reference-free single-ended sensing of the logic value (e.g., a logic value of "0" or a logic value of "1") of a stored bit in any selected memory cell 101 located in a specific column and a specific row in the array 110.

The sense circuit 194 can include a switch 142 and, particularly, a footer device that is controlled by a sense enable (SEN) signal from the controller 190 and that is configured to selectively connect the sense circuit 194 to ground depending upon the state of the SEN signal. For example, the switch 142 can be a first pull-down field effect transistor (FET) and, particularly, a first n-type field effect transistor (NFET) with a source region connected to ground and a gate controlled by SEN. Alternatively, the switch 142 could be any other suitable footer device.

The sense circuit 194 can further include multiple field effect transistors 141a-141c connected in parallel between an output node 143 and the switch 142. The multiple field effect transistors 141a-141c can be formed according to the same design so that, absent process variations, they are essentially identical. For purposes of illustration, three FETs 141a-141c are shown in the figures. However, it should be understood that the figures are not intended to be limiting and that, alternatively, any number of two or more FETs could be connected in parallel between the output node 143 and the switch 142. In any case, the FETs can be second pull-down field effect transistors and, particularly, second NFETs. Each of the second pull-down FETs 141a-141c can have a smaller drive strength than the switch 142. For example, if the switch 142 is a first pull-down FET, the first pull-down FET can be larger (e.g., have a greater channel width) than each of the second pull-down FETs 141a-141c and, thus, can have a greater drive strength than any of the second pull-down FETs.

The sense circuit 194 can include an additional switch 145 and, particularly, a header device that is controlled by a reset (RST) signal from the controller and that is configured to selectively connect the output node 143 to a positive supply voltage rail (e.g., VDD) depending upon the state of the RST signal. For example, the additional switch 145 can be a pull-up FET and, particularly, p-type FET (PFET) with a source region connected to the positive supply voltage rail and a gate controlled by RST so that, when RST is low, the level of the output voltage on the output node 143 can be pulled up from at or above a first voltage level (e.g., from ground) to a second voltage level (e.g., VDD) that is greater than the first voltage level.

The sense circuit 194 can further include multiple inverters 140a-140c, one for each of the second pull-down FETs 141a-141c. For example, in the embodiments shown in the figures there are three second pull-down FETs 141a-141c and also three inverters 140a-140c. However, alternatively, there could be two second pull-down FETs and two inverters, four second pull-down FETs and four inverters, etc. In any case, the multiple inverters 140a-140c can be formed according to the same design so that, absent process variations, they are essentially identical in structure. Furthermore, the multiple inverters 140a-140c can be connected between the data line 121 and the gates of the corresponding second pull-down FETs 141a-141c, respectively. That is, each inverter 140a-140c can have an input, which is directly connected to a node on the data line 121, and an output, which is connected to the gate of a corresponding one of the second pull-down FETs 141a-141c. Since, as mentioned above, the second pull-down FETs 141a-141c are NFETs, when the output state of an inverter is low, then the second pull-down FET to which it is connected will be in an off-state. However, when the output state of an inverter is high, then the second pull-down FET to which it is connected will switch to an on-state (i.e., will turn on).

The sense circuit 194 can further include a latch 144 connected to the output node 143. The latch 144 can include, for example, a pair of inverters connected in a loop at the output node 143 (as illustrated). That is, the latch 144 can include a first inverter and a second inverter connected in a loop with the input of the first inverter and the output of the second inverter each connected to the output node 143 and with the output of the first inverter connected to the input of the second inverter. With this configuration, the latch 144 can sense the level of the output voltage on the output node 143. More particularly, the latch 144 can capture, store, and output a digital value (Q) that is indicative of whether, at the end of the read operation, the output node 143 is at the first voltage level (e.g., ground) indicating a stored bit with a first logic value (e.g., a logic value of "0") or at a second voltage level (e.g., VDD) indicating a stored bit with a second logic value (e.g., a "1"). Alternatively, the latch 144 can have any other configuration suitable for sensing the voltage level on the output node 143 at the end of a read operation and, more particularly, for capturing, storing, and outputting a digital value (Q) that is indicative of whether, at the end of the read operation, the output node 143 is at a first voltage level (e.g., ground) indicating a stored bit with a first logic value (e.g., a "0") or at a second voltage level (e.g., VDD) indicating a stored bit with a second logic value (e.g., a "1").

With a sense circuit 194 configured as described above, a read operation to determine the logic value of a stored bit in a specific memory cell 101 (i.e., a selected memory cell) located in a specific column and a specific row within the memory array 110 can be performed without having to generate a reference parameter.

Specifically, during a read operation of a specific memory cell (i.e., a selected memory cell) located at a specific column and a specific row, the level of the output voltage on the output node 143 of the sense circuit 194 can be reset. For example, while the SEN signal is low such that the switch 142 (i.e., the first pull-down FET) is turned off, the RST signal can be switched from high to low in order to turn on the additional switch 145 (i.e., the pull-up transistor), thereby connecting the output node 143 to the positive supply voltage rail and pulling up the output voltage on the output node 143 from at or above the first voltage level (e.g., ground) to the second voltage level (e.g., to VDD). The RST signal can then be switched back to high, thereby turning off the additional switch 145.

After the output node 143 has been reset and in response to a column address signal from the controller 190, the column control block 192 can cause the bitline 111 for the specific column to be pre-charged (e.g., to VDD) and can further cause the source line 113 for the specific column to be discharged to ground. Additionally, in response to the column address signal from the controller 190, the column decoder 193 can selectively connect the bitline 111 for the specific column to the data line 121. Subsequently, in response to a row address signal from the controller 190, the row control block 191 can cause a wordline voltage to be applied to the wordline 112 for the specific row. It should be noted that the level of the wordline voltage can vary depending upon the type of memory cells within the array (see detailed discussion below). In any case, in conjunction with the wordline voltage being applied to the specific wordline, the SEN signal can switch states from low to high and remain high for a predetermined period of time (Ts) (also referred to herein as a sense time) so as to turn on the switch 142 (i.e., the first pull-down transistor) and thereby turn on the sense circuit 194 for the predetermined period of time (Ts). Depending upon the programmed state of the specific memory cell, the output voltage on the output node 143 will be pulled down to the first voltage level (e.g., to ground) or will remain at the second voltage level (e.g., at VDD) (as discussed in greater detail below). Finally, at the end of the predetermined period of time (Ts), the SEN signal can switch states from high to low so as to turn off the switch 142 (i.e., the first pull-down transistor) and thereby turn off the sense circuit 194 and the latch 144 can sense the level of the output voltage on the output node 143 and, more particularly, can capture, store, and output a digital value (Q) representing the output voltage and, thereby the logic value of the stored bit in the specific memory cell 101.

More particularly, as mentioned above, in some embodiments the memory cells 101 can be resistance-programmable NVM cells. In a resistance-programmable NVM cell, as shown in FIG. 2, the wordline voltage can be a positive supply voltage that is at or above the threshold voltage of the access transistor 210. For example, the wordline voltage can be set at VDD.

In this case, when the bitline 111 is pre-charged, the source line 113 is discharged to ground, and the access transistor 210 is turned on in response to the applied wordline voltage, current will flow from the bitline 111 through the programmable resistor 220 and further through the access transistor 210 to the source line 113 and, as a result, the voltage level on the bitline 111 and, thereby the voltage level on the data line 121 will begin to drop. However, the rate at which the voltage drops will be faster or slower depending upon whether the programmable resistor 220 is in a low resistance state or a high resistance state, respectively. That is, when the programmable resistor 220 is in a low resistance state, the voltage level on the bitline 111 and thereby the voltage level on the data line 121 will drop at a first rate, whereas when the programmable resistor 220 is in a high resistance state, the voltage level on the bitline 111 and thereby the voltage level on the data line 121 will drop at a second rate that is slower than the first rate.

During the read operation when the wordline voltage is applied to the specific wordline, the SEN signal can also be switched from low to high and can remain high for a predetermined period of time (referred to herein as the sense time period (Ts)) so as to turn on the switch 142 (i.e., the first pull-down transistor) and thereby turn on the sense circuit 194 for the predetermined period of time (Ts). The predetermined time period (Ts) can be set so that the sense circuit 194 is turned on for a period of time that is long enough for at least one of the inverter(s) to register a voltage drop on the data line (i.e., to switch output states) when the programmable resistor 220 is in a low resistance state but not long enough to register a voltage drop on the data line (i.e., to switch output states) when the programmable resistor 220 is in a high resistance state. That is, the predetermined time period (Ts) can be predetermined so that, when the programmable resistor 220 in any given memory cell 101 is in the low resistance state, at least one of the inverters 140a-140c will have time to detect (i.e., register) a voltage drop on the data line 121 before the end of the predetermined period of time (Ts), even in the presence of process and/or thermal variations. The predetermined time period (Ts) can also be predetermined so that, when the programmable resistor 220 in any given memory cell 101 is in the high resistance state, none of the inverters 140a-140c will have time to detect (i.e., register) the voltage drop on the data line 121 until after the end of the predetermined period of time (Ts).

Figure 7A:
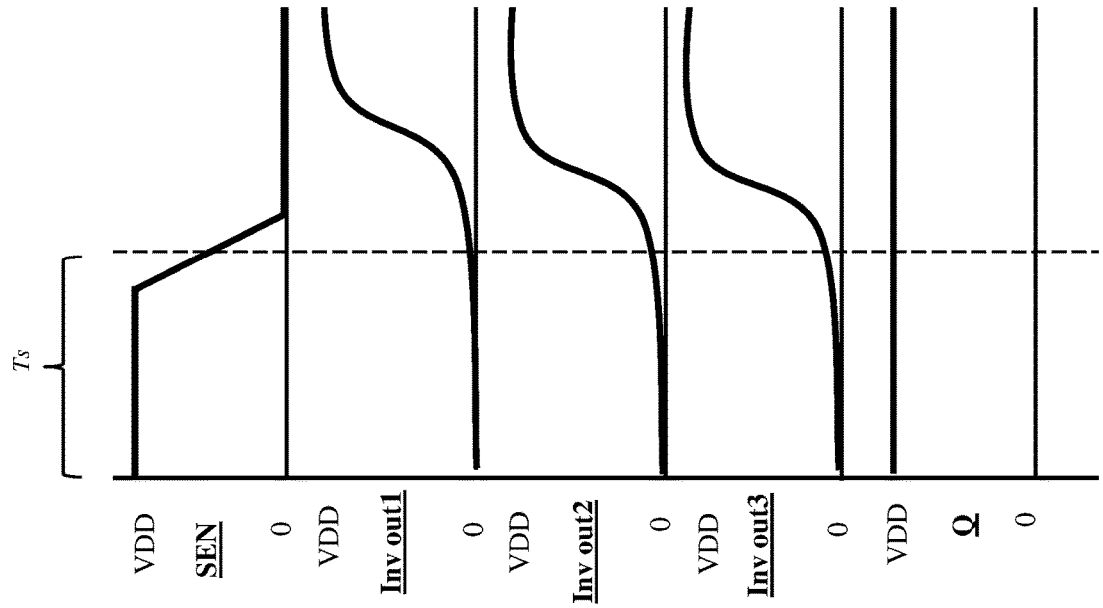
FIGS. 7A-7B are timing diagrams illustrating exemplary sense circuit signals when a resistance-programmable NVM cell stores a first logic value and a second logic value, respectively.
Figure 7B:
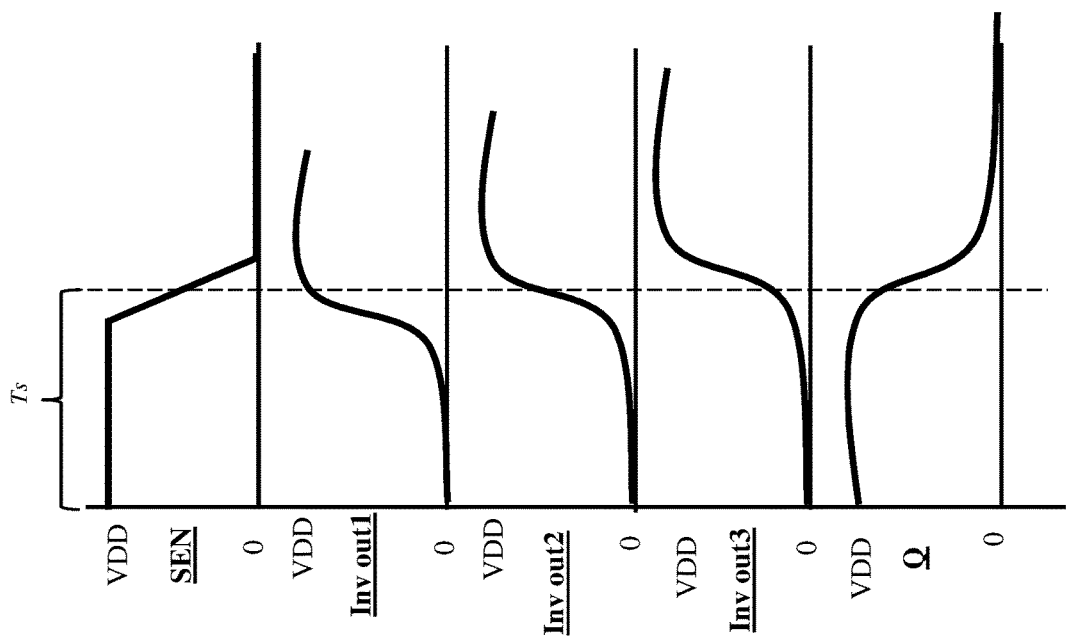

FIGS. 7A-7B are timing diagrams illustrating exemplary sense circuit signals when a specific memory cell and, particularly, a resistance-programmable NVM cell stores a first logic value (e.g., a logic value of "0") and a second logic value (e.g., a logic value of "1"), respectively. Referring to FIG. 7A, the occurrence of a sufficient voltage drop on the data line 121 within the predetermined period of time (Ts) will cause at least one of the inverters 140a-140c to switch output states from low to high, thereby turning on at least one of the multiple FETs 141a-141c (i.e., at least one of the second pull-down transistors). Furthermore, when the switch 142 (e.g., the first pull-down FET) is turned on and when at least one of the second pull-down 141a-141c turns on during the predetermined time period (Ts), the level of the output voltage on the output node 143 will be pulled down from the second voltage level (e.g., from VDD) to the first voltage level (e.g., to ground) through the second pull-down FET(s) 141a, 141b and/or 141c and further through the switch 142. Thus, at the end of the predetermined period of time (Ts), the digital value (Q) captured, stored, and output by the latch 144 will be a "0" corresponding to the first voltage level (e.g., ground). Referring to FIG. 7B, if the voltage drop on the data line 121 is insufficient to cause any of the inverters 140a-140c to switch output states from low to high such that none of the second pull-down FETs 141a-141c turn on, then the output voltage on the output node 143 will remain at the second voltage level (e.g., at VDD). Thus, at the end of the predetermined period of time (Ts), the digital value (Q) captured, stored, and output by the latch 144 will be a "1" corresponding to the second voltage level (e.g., VDD).

As mentioned above, in other embodiments the memory cells 101 can be Vt-programmable NVM cells. Each Vt-programmable NVM cell can include, for example, a Vt-programmable NFET 610, as described above and illustrated in FIG. 6. In this case, the wordline voltage can be a positive supply voltage that is at some level between a first Vt when the Vt-programmable NFET 610 is in a low Vt state and a second Vt that is higher than the first Vt when the Vt-programmable transistor is in a high Vt state. For example, the wordline voltage can be set so that it is approximately halfway between the low Vt state and the high Vt state of a nominal Vt-programmable transistor. If the Vt-programmable NFET 610 is in the low-Vt state and the bitline 111 is pre-charged, the source line 113 is discharged to ground, and the wordline voltage is applied to the gate 620, then current will flow from the bitline 111 through the Vt-programmable NFET 610 to the source line 113. As a result, the voltage level on the bitline 111 and, thereby the voltage level on the data line 121 will drop. However, if the Vt-programmable NFET 610 is in the high-Vt state and the bitline 111 is pre-charged, the source line 113 is discharged to ground, and the wordline voltage is applied to the gate 620, then current will not flow from the bitline 111 through the Vt-programmable NFET 610 to the source line 113. As a result, the voltage level on the bitline 111 and, thereby the voltage level on the data line 121 will not drop. During the read operation when the wordline voltage is applied to the specific wordline, the SEN signal can also be switched from low to high and can remain high for a predetermined period of time (referred to herein as the sense time period (Ts)) so as to turn on the switch 142 (i.e., the first pull-down transistor) and thereby turn on the sense circuit 194 for the predetermined period of time (Ts). When the Vt-programmable NFET 610 is in the low-Vt state and has turned on in response to the wordline voltage, a resulting voltage drop on the data line 121 within the predetermined period of time (Ts) will cause at least one of the inverters 140a-140c to switch output states from low to high, thereby turning on at least one of the multiple FETs 141a-141c (i.e., at least one of the second pull-down transistors). As a result, the level of the output voltage on the output node 143 will be pulled down from the second voltage level (e.g., from VDD) to the first voltage level (e.g., to ground) through the second pull-down FET(s) 141a, 141b and/or 141c and further through the switch 142. Thus, at the end of the predetermined period of time (Ts), the digital value (Q) captured, stored, and output by the latch 144 will be a "0" corresponding to the first voltage level (e.g., ground). However, when the Vt-programmable NFET 610 is in the high-Vt state and does not turn on in response to the wordline voltage, then none of the inverters 140a-140c will switch output states from low to high and none of the second pull-down FETs 141a-141c will turn on within the predetermined period of time (Ts). As a result, the output voltage on the output node 143 will remain at the second voltage level (e.g., at VDD). Thus, at the end of the predetermined period of time (Ts), the digital value (Q) captured, stored, and output by the latch 144 will be a "1" corresponding to the second voltage level (e.g., VDD).

Figure 8:
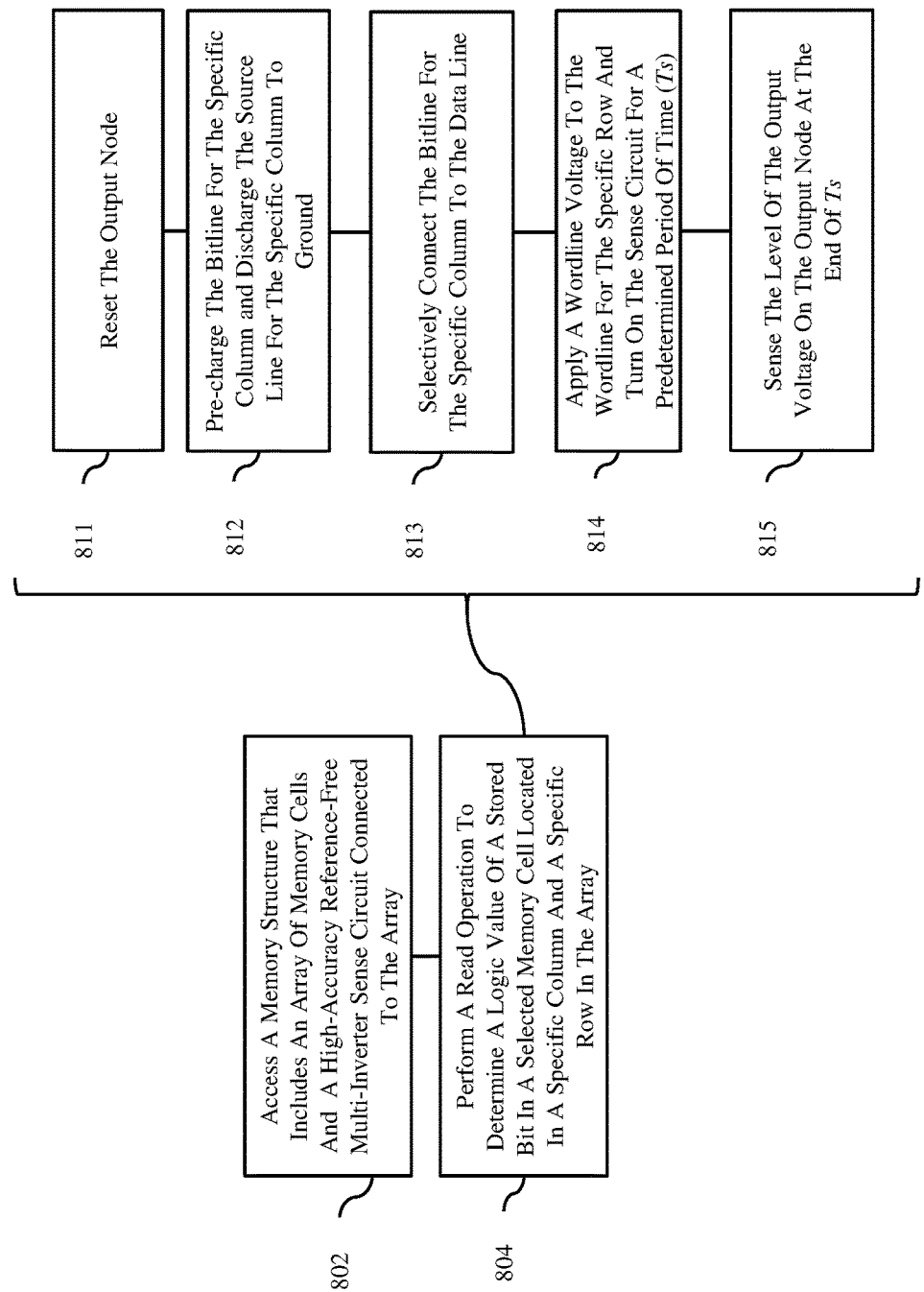
FIG. 8 is a flow diagram illustrating embodiments of a disclosed sensing method.

Referring to the flow diagram of FIG. 8, disclosed herein are associated sensing method embodiments. The method embodiments can include accessing a memory structure 100, as described in detail above and illustrated in FIG. 1 (see process step 802). The method embodiments can further include performing a read operation directed to a specific memory cell 101 (i.e., a selected memory cell) located at a specific column and a specific row within the array 110 (see process step 804). This read operation can include using a high-accuracy reference-free single-ended sensing scheme to determine the logic value of a stored bit in the specific memory cell 101.

Specifically, during a read operation at process step 804, the voltage level on the output node 143 of the sense circuit 194 can be reset (see process step 811). For example, while the SEN signal is low such that the switch 142 (i.e., the first pull-down FET) is turned off, the RST signal can be switched from high to low in order to turn on the additional switch 145 (i.e., the pull-up transistor), thereby connecting the output node 143 to the positive supply voltage rail and pulling up the output voltage on the output node 143 from at or above a first voltage level (e.g., ground) to a second voltage level (e.g., to VDD). The RST signal can then be switched back to high turning off the additional switch 145. After the output node 143 has been reset, the bitline 111 for the specific column can be pre-charged (e.g., to VDD) and the source line 113 for the specific column can be discharged to ground (e.g., by the column control block 192 in response to a column address signal from the controller 190) (see process step 812). Additionally, the bitline 111 for the specific column can be selectively connected to the data line 121 (e.g., by the column decoder 193 in response to the column address signal from the controller 190) (see process step 813). Subsequently, a wordline voltage can be applied to the wordline 112 for the specific row (e.g., by the row control block 191 in response to a row address signal from the controller 190) and the sense circuit 194 can be turned on for a predetermined period of time (Ts) (e.g., by switching of the SEN signal from low to high) (see process step 814). Depending upon the programmed state of the specific memory cell, the output voltage on the output node 143 will be pulled down to the first voltage level (e.g., to ground) or will remain at the second voltage level (e.g., at VDD) (as discussed in greater detail below). Finally, at the end of the predetermined period of time (Ts), the switch 142 (i.e., the first pull-down transistor) and thereby the sense circuit 194 can be turned off (e.g., by switching of the SEN signal from high to low) and the output voltage on the output node 143 can be sensed and, more particularly, can be captured, stored, and output as a digital value (Q) (e.g., by the latch 144) (see process step 815). The digital value (Q) can represent the output voltage and, thereby the logic value of the stored bit in the specific memory cell 101.

For example, in some embodiments, the memory cells 101 can be resistance-programmable NVM cells, as described in detail above and illustrated in FIG. 2. In such a resistance-programmable NVM cell, the wordline voltage applied at process step 814 can be a positive supply voltage that is at or above the threshold voltage of the access transistor 210. For example, the wordline voltage can be set at VDD. In this case, following process step 814, current will flow from the bitline 111 through the programmable resistor 220 and further through the access transistor 210 to the source line 113. As a result, the voltage level on the bitline 111 and, thereby the voltage level on the data line 121 will begin to drop. If a sufficient voltage drop occurs on the data line 121 within the predetermined period of time (Ts), it will cause at least one of the inverters 140a-140c to switch output states from low to high, thereby turning on at least one of the multiple FETs 141a-141c (i.e., at least one of the second pull-down transistors). Furthermore, when the switch 142 (e.g., the first pull-down FET) is turned on and when at least one of the second pull-down 141a-141c turns on during the predetermined time period (Ts), the output voltage on the output node 143 will be pulled down from the second voltage level (e.g., from VDD) to the first voltage level (e.g., to ground) through the second pull-down FET(s) 141a, 141b and/or 141c and further through the switch 142. Thus, at the end of the predetermined period of time (Ts) at process step 815, the digital value (Q) that is captured, stored, and output by the latch 144 will be a "0" corresponding to the first voltage level (e.g., ground). However, if the voltage drop within the predetermined time period (Ts) is not sufficient to cause any of the inverters 140a-140c to switch output states from low to high such that none of the second pull-down FETs 141a-141c turn on, then the output voltage on the output node 143 will remain at the second voltage level (e.g., at VDD). Thus, at the end of the predetermined period of time (Ts) at process step 815, the digital value (Q) captured, stored, and output by the latch 144 will be a "1" corresponding to the second voltage level (e.g., VDD). See also FIGS. 7A-7B and the detailed discussion above with regard to the structure embodiments.

In other embodiments, the memory cells 101 can be Vt-programmable NVM cells, for example, as described in detail above and illustrated in FIG. 6. In such a Vt-programmable NVM cell, the wordline voltage can be a positive supply voltage that is at some level between a first Vt when the Vt-programmable NFET 610 is in a low Vt state and a second Vt that is higher than the first Vt when the Vt-programmable NFET 610 is in a high Vt state. For example, the wordline voltage can be set so that it is approximately halfway between the low Vt state and the high Vt state of a nominal Vt-programmable NFET. In this case, when a Vt-programmable NFET 610 is in the low-Vt state, at process step 814 current will flow from the bitline 111 through the Vt-programmable NFET 610 to the source line 113. As a result, the voltage level on the bitline 111 and, thereby the voltage level on the data line 121 will drop. If a sufficient voltage drop occurs on the data line 121 within the predetermined period of time (Ts), it will cause at least one of the inverters 140a-140c to switch output states from low to high, thereby turning on at least one of the multiple FETs 141a-141c (i.e., at least one of the second pull-down transistors). Furthermore, when the switch 142 (e.g., the first pull-down FET) is turned on and when at least one of the second pull-down 141a-141c turns on during the predetermined time period (Ts), the output voltage on the output node 143 will be pulled down from the second voltage level (e.g., from VDD) to the first voltage level (e.g., to ground) through the second pull-down FET(s) 141a, 141b and/or 141c and further through the switch 142. Thus, at the end of the predetermined period of time (Ts) at process step 815, the digital value (Q) that is captured, stored, and output by the latch 144 will be a "0" corresponding to the first voltage level (e.g., ground). However, when a Vt-programmable NFET 610 is in the high-Vt state, then following process step 814 current will not flow from the bitline 111 through the Vt-programmable NFET 610 to the source line 113. As a result, the voltage level on the bitline 111 and, thereby the voltage level on the data line 121 will remain high such that the output states of the inverters 140a-140c remain low, none of the second pull-down FETs 141a-141c turn on, and the output voltage on the output node 143 remains at the second voltage level (e.g., at VDD). Thus, at the end of the predetermined period of time (Ts) at process step 815, the digital value (Q) captured, stored, and output by the latch 144 will be a "1" corresponding to the second voltage level (e.g., VDD).

In the structure and method embodiments described above, the use of redundant inverters 140a-140c to control redundant second pull-down FETs 141a-141c, which are connected to the output node 143, increases the likelihood that the occurrence of a voltage drop on the data line 121 within the predetermined period of time (Ts) will be accurately detected and captured at the output node 143 by the latch 144, even in the presence of process and/or thermal variations and without the need to generate a reference parameter for comparison. However, it should be understood that the SEN signal, which as discussed above is used for turning on and off the sense circuit 194 and, particularly, for setting the predetermined time period (Ts) for each read operation, will require trimming for optimized performance. Trimming bits can be calibrated to get the best bit error rate (BER) over different process-voltage-temperature (PVT) variations. For example, each die can be tested to find the optimal trim bits which are stored in the scan chain. Either memory built-in self-test (MBIST) with a joint test action group (JTAG) interface or a manual load can be used to load the registers. Trimming can be performed in parallel using BIST while having individual trim codes for optimal setting. This enables column wise tracking of PVT variation. The precise timing of the SEN signal can be determined during the optimization phase with timer bits ranging, for example, from 100 ps to 500 ps with a resolution of, for example, 10 ps. Optimal settings can be stored in non-volatile resistive (NVR) array in test enable mode.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a data line; and
a sense circuit comprising:
an output node;
a switch;
multiple pull-down field effect transistors connected in parallel between the output node and the switch; and
multiple inverters, wherein an input of each inverter is connected to the data line and an output of each inverter is connected to a gate of a corresponding one of the multiple pull-down field effect transistors,
wherein the switch comprises a pull-down transistor connecting the sense circuit to ground,
wherein the pull-down transistor of the switch turns on for a predetermined period of time in response to a sense enable signal,
wherein at an end of the predetermined period of time an output voltage on the output node is at one of a first voltage level and a second voltage level that is greater than the first voltage level,
wherein the output voltage is at the first voltage level when a voltage drop on the data line within the predetermined period of time causes at least one of the multiple inverters to switch output states from low to high so that at least one of the multiple pull-down field effect transistors turns on and pulls down the output voltage, and wherein the output voltage is at the second voltage level when all of the multiple pull down field effect transistors remain off.

2. The structure of claim 1, further comprising a latch connected to the output node.

3. The structure of claim 1, wherein the multiple pull-down field effect transistors are each smaller than the pull-down transistor of the switch.

4. The structure of claim 1, further comprising:
an array of memory cells arranged in columns and rows;
wordlines for the rows, wherein each wordline for each row is connected to all the memory cells in the row;
bitlines for the columns, wherein each bitline for each column is connected to all of the memory cells in the column;
source lines for the columns, wherein each source line for each column is connected to all of the memory cells in the column; and
peripheral circuitry connected to the wordlines, the bitlines and the source lines,
wherein, during a read operation to determine a logic value of a stored bit in a specific memory cell at a specific row and a specific column, the peripheral circuitry causes a specific bitline for the specific column to be pre-charged and connected to the data line and further causes a wordline voltage to be applied to a specific wordline for the specific row such that, when the switch turns on for the predetermined period of time, the specific memory cell discharges a voltage on the specific bitline at a first rate if the stored bit has a first logic value and at a second rate that is slower than the first rate if the stored bit has a second logic value.

5. The structure of claim 4, wherein each memory cell in each column and each row comprises: an access transistor and a programmable resistor connected in series between a source line for the column and a bitline for the column, and wherein the access transistor has a gate connected to the wordline for the row.

6. The structure of claim 5, wherein the programmable resistor comprises any of a magnetic tunnel junction-type variable resistor, a phase change memory-type variable resistor, and a memristor.

7. The structure of claim 4, wherein each memory cell in each column and each row comprises: a threshold voltage programmable transistor between a source line for the column and a bitline for the column, and wherein the threshold voltage programmable transistor has a gate connected to the wordline for the row.

8. A structure comprising:
a data line; and
a sense circuit comprising:
an output node;
a first pull-down transistor;
three second pull-down transistors connected in parallel between the output node and the first pull-down transistor, wherein the first pull-down transistor is further connected to ground; and
three inverters, wherein an input of each inverter is connected to the data line and an output of each inverter is connected to a gate of a corresponding one of the three second pull-down transistors,
wherein the first pull-down transistor is connected between ground and the second pull-down transistors and is larger than the second pull-down transistors,
wherein the first pull-down transistor turns on for a predetermined period of time in response to a sense enable signal,
wherein at an end of the predetermined period of time an output voltage on the output node is at one of a first voltage level and a second voltage level that is greater than the first voltage level,
wherein the output voltage is at the first voltage level when a voltage drop on the data line within the predetermined period of time causes at least one of the three inverters to switch output states from low to high so that at least one of the three second pull-down transistors turns on and pulls down the output voltage, and
wherein the output voltage is at the second voltage level when all of the three second pull-down transistors remain off.

9. The structure of claim 8, further comprising a latch connected to the output node.

10. The structure of claim 8, further comprising:
an array of memory cells arranged in columns and rows;
wordlines for the rows, wherein each wordline for each row is connected to all the memory cells in the row;
bitlines for the columns, wherein each bitline for each column is connected to all of the memory cells in the column;
source lines for the columns, wherein each source line for each column is connected to all of the memory cells in the column; and
peripheral circuitry connected to the wordlines, the bitlines and the source lines,
wherein, during a read operation to determine a logic value of a stored bit in a specific memory cell at a specific row and a specific column, the peripheral circuitry causes a specific bitline for the specific column to be pre-charged and connected to the data line and further causes a wordline voltage to be applied to a specific wordline for the specific row such that, when the first pull-down transistor turns on for the predetermined period of time, the specific memory cell discharges a voltage on the specific bitline at a first rate if the stored bit has a first logic value and at a second rate that is slower than the first rate if the stored bit has a second logic value.

11. The structure of claim 10, wherein each memory cell in each column and each row comprises: an access transistor and a programmable resistor connected in series between a source line for the column and a bitline for the column, and wherein the access transistor has a gate connected to the wordline for the row.

12. The structure of claim 11, wherein the programmable resistor comprises any of a magnetic tunnel junction-type variable resistor, a phase change memory-type variable resistor, and a memristor.

13. The structure of claim 10, wherein each memory cell in each column and each row comprises: a threshold voltage programmable transistor between a source line for the column and a bitline for the column, and wherein the threshold voltage programmable transistor has a gate connected to the wordline for the row.

14. A method comprising:
accessing a memory structure comprising:
a memory array comprising an array of memory cells;
a data line connected to the memory array; and
a sense circuit comprising:
an output node;
a switch;
multiple field effect transistors connected in parallel between the output node and the switch; and multiple inverters, wherein each inverter is connected between the data line and a gate of a corresponding one of the multiple field effect transistors; and performing a read operation comprising:

turning on the switch for a predetermined period of time; and sensing an output voltage on the output node at an end of the predetermined period of time, wherein at the end of the predetermined period of time the output voltage on the output node is at one of a first voltage level and a second voltage level that is greater than the first voltage level, and wherein the output voltage is at the first voltage level at the end of the predetermined period of time when a voltage drop on the data line causes at least one of the multiple inverters to switch output states so that at least one of the multiple field effect transistors turns on and pulls the output voltage down to the first voltage level from the second voltage level.

15. The method of claim 14, wherein the memory cells in the array are arranged in columns and rows;

wordlines for the rows, wherein each wordline for each row is connected to all the memory cells in the row;

bitlines for the columns, wherein each bitline for each column is connected to all of the memory cells in the column;

source lines for the columns, wherein each source line for each column is connected to all of the memory cells in the column, wherein the read operation determines a logic value of a stored bit in a specific memory cell at a specific row and a specific column, and wherein the performing of the read operation further comprises:

pre-charging a specific bitline for the specific column;

connecting the specific bitline to the data line; and applying a wordline voltage to a specific wordline for the specific row such that, when the switch turns on for the predetermined period of time, the specific memory cell discharges a voltage on the specific bitline at a first rate if the stored bit has a first logic value and at a second rate that is slower than the first rate if the stored bit has a second logic value.

16. The method of claim 15, wherein each memory cell in each column and each row comprises: an access transistor and a programmable resistor connected in a series between a source line for the column and a bitline for the column, and wherein the access transistor has a gate connected to the wordline for the row.

17. The method of claim 16, wherein the programmable resistor comprises any of a magnetic tunnel junction-type variable resistor, a phase change memory-type variable resistor, and a memristor.

18. The method of claim 15, wherein each memory cell in each column and each row comprises: a threshold voltage programmable transistor between a source line for the column and a bitline for the column, and wherein the threshold voltage programmable transistor has a gate connected to the wordline for the row.

* * * * *